United States Patent
Kajiwara et al.

(10) Patent No.: US 11,473,210 B2
(45) Date of Patent: Oct. 18, 2022

(54) HEAT SHIELDING MEMBER, SINGLE CRYSTAL PULLING APPARATUS, AND METHOD OF PRODUCING SINGLE CRYSTAL SILICON INGOT

(71) Applicant: SUMCO CORPORATION, Tokyo (JP)

(72) Inventors: Kaoru Kajiwara, Tokyo (JP); Ryota Suewaka, Tokyo (JP); Shunji Kuragaki, Tokyo (JP); Kazumi Tanabe, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 59 days.

(21) Appl. No.: 16/500,183

(22) PCT Filed: Mar. 16, 2018

(86) PCT No.: PCT/JP2018/010519
§ 371 (c)(1),
(2) Date: Oct. 2, 2019

(87) PCT Pub. No.: WO2018/186150
PCT Pub. Date: Oct. 11, 2018

(65) Prior Publication Data
US 2020/0224327 A1    Jul. 16, 2020

(30) Foreign Application Priority Data

Apr. 5, 2017  (JP) .............................. JP2017-075534

(51) Int. Cl.
*C30B 15/14*    (2006.01)
*C30B 29/06*    (2006.01)

(52) U.S. Cl.
CPC .............. *C30B 15/14* (2013.01); *C30B 29/06* (2013.01)

(58) Field of Classification Search
CPC ........ C30B 15/14; C30B 15/203; C30B 29/06
See application file for complete search history.

(56) References Cited

U.S. PATENT DOCUMENTS 6,146,459 A * 11/2000 Park ..................... C30B 15/14
                                                            117/900
8,414,701 B2   4/2013 Takanashi
(Continued)

FOREIGN PATENT DOCUMENTS

CN    102352530 B    2/2012
CN    105239150 A *  1/2016
(Continued)

OTHER PUBLICATIONS

Office Action issued in Chinese Counterpart Patent Appl. No. 201880022285.5, dated Nov. 30, 2020, along with an English translation thereof.
(Continued)

*Primary Examiner* — Hua Qi
(74) *Attorney, Agent, or Firm* — Greenblum & Bernstein, P.L.C.

(57) ABSTRACT

Provided is a heat shielding member, a single crystal pulling apparatus, and a method of producing a single crystal silicon ingot, which can expand the margin of the crystal pulling rate with which a defect-free single crystal silicon can be obtained. A heat shielding member is provided in a single crystal pulling apparatus, the heat shielding member including a cylindrical tubular portion surrounding an outer circumferential surface of the single crystal silicon ingot; and a ring-shaped projecting portion under the tubular portion. The projecting portion has an upper wall, a bottom wall, and two vertical walls, a heat insulating material with a ring shape is provided in the space surrounded by those walls; and a gap between the vertical wall adjacent to the single crystal silicon ingot and the heat insulating material.

8 Claims, 8 Drawing Sheets

(56) References Cited

U.S. PATENT DOCUMENTS

| | | | |
|---|---|---|---|
| 8,871,023 | B2 | 10/2014 | Takanashi et al. |
| 9,074,298 | B2 | 7/2015 | Kawazoe et al. |
| 9,284,660 | B2 | 3/2016 | Takanashi et al. |
| 9,567,692 | B2 | 2/2017 | Takanashi et al. |
| 9,903,044 | B2 | 2/2018 | Tanabe et al. |
| 10,490,398 | B2 | 11/2019 | Nakamura et al. |
| 2004/0055531 | A1* | 3/2004 | Ferry .................. C30B 15/14 117/217 |
| 2005/0257736 | A1 | 11/2005 | Shimosaka et al. |
| 2006/0124052 | A1* | 6/2006 | Harada .................. C30B 15/14 117/217 |
| 2007/0119365 | A1 | 5/2007 | Harada et al. |
| 2008/0053372 | A1 | 3/2008 | Anttila et al. |
| 2011/0017948 | A1 | 1/2011 | Fukuda |
| 2019/0330760 | A1 | 10/2019 | Suewaka |

FOREIGN PATENT DOCUMENTS

| | | |
|---|---|---|
| CN | 105239150 A | 1/2016 |
| DE | 102014226297 A1 | 6/2016 |
| JP | 2000-327479 A | 11/2000 |
| JP | 2004-107132 A | 4/2004 |
| JP | 2004-123516 A | 4/2004 |
| JP | 2005-213097 A | 8/2005 |
| JP | 2007-182355 A | 7/2007 |
| JP | 2013-075785 A | 4/2013 |
| KR | 10-2002-0014047 A | 2/2002 |
| KR | 1020090008969 A | 1/2009 |
| TW | 200404922 A | 4/2004 |

OTHER PUBLICATIONS

V. V. Voronkov, "The Mechanism of Swirl Defects Formation in Silicon," Journal of Crystal Growth, vol. 59, Mar. 1, 1982, pp. 625-643.

U.S. Appl. No. 16/471,805 to Yasuhito Narushima et al., filed Jun. 20, 2019.

U.S. Appl. No. 16/484,619 to Fukuo Ogawa et al., filed Aug. 8, 2019.

International Search Report issued in WIPO Patent Application No. PCT/JP2018/010519, dated May 22, 2018.

Office Action issued in Taiwan family member Patent Appl. No. 107107667, dated Nov. 26, 2018.

Office Action issued in Republic of Korea Counterpart Patent Appl. No. 10-2019-7028145, dated Nov. 12, 2020, along with an English translation thereof.

International Preliminary Report on Patentability issued in WIPO Patent Application No. PCT/JP2018/010519, dated Oct. 8, 2019.

Office Action issued in Chinese Counterpart Patent Appl. No. 201880022285.5, dated Sep. 2, 2021, along with an English translation thereof.

Office Action issued in China Counterpart Patent Appl. No. 201880022285.5, dated May 28, 2021, along with an English translation thereof.

Office Action issued in German Counterpart Patent Appl. No. 112018001896.2, dated Jan. 20, 2022, along with an English languae translation.

\* cited by examiner

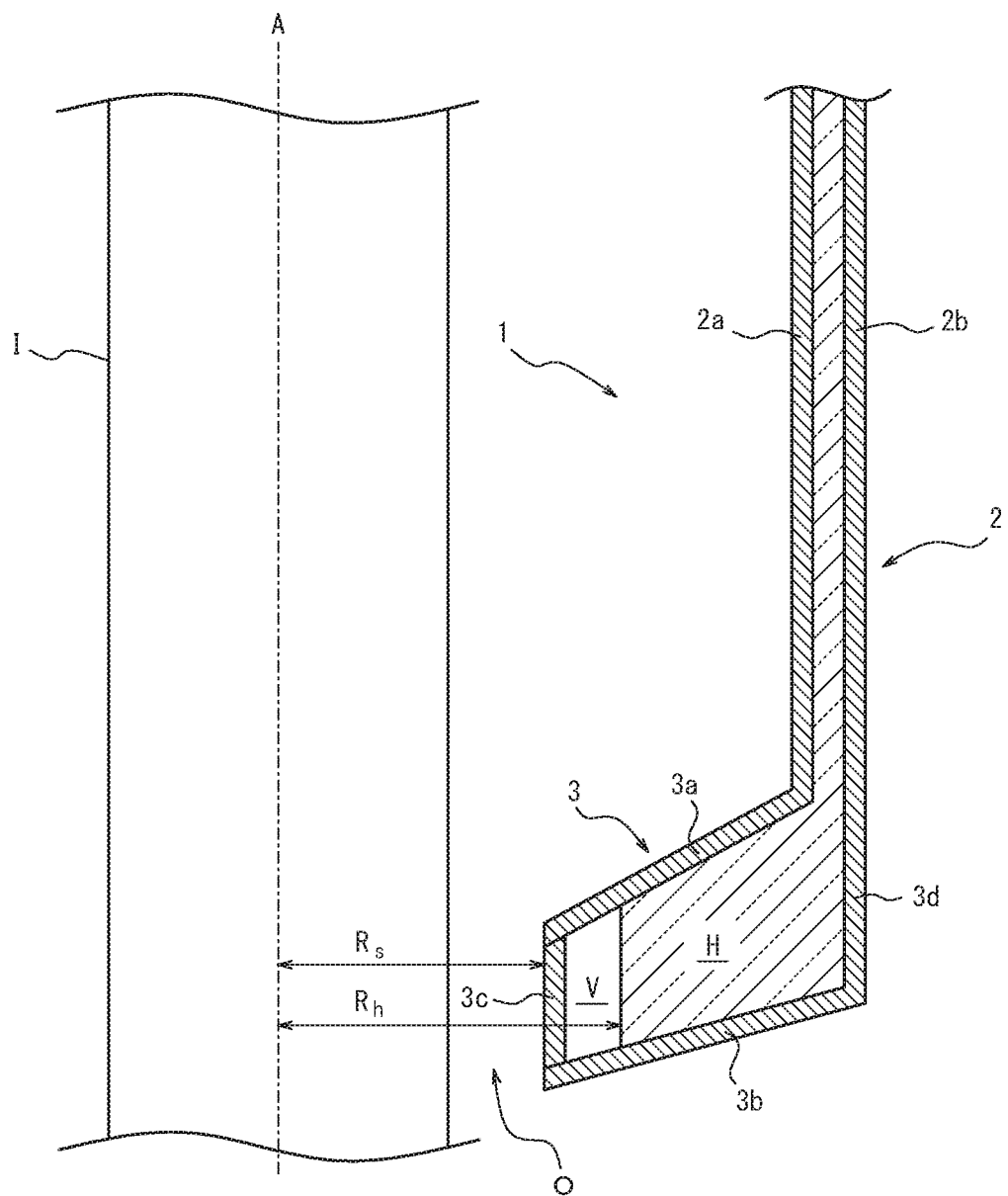

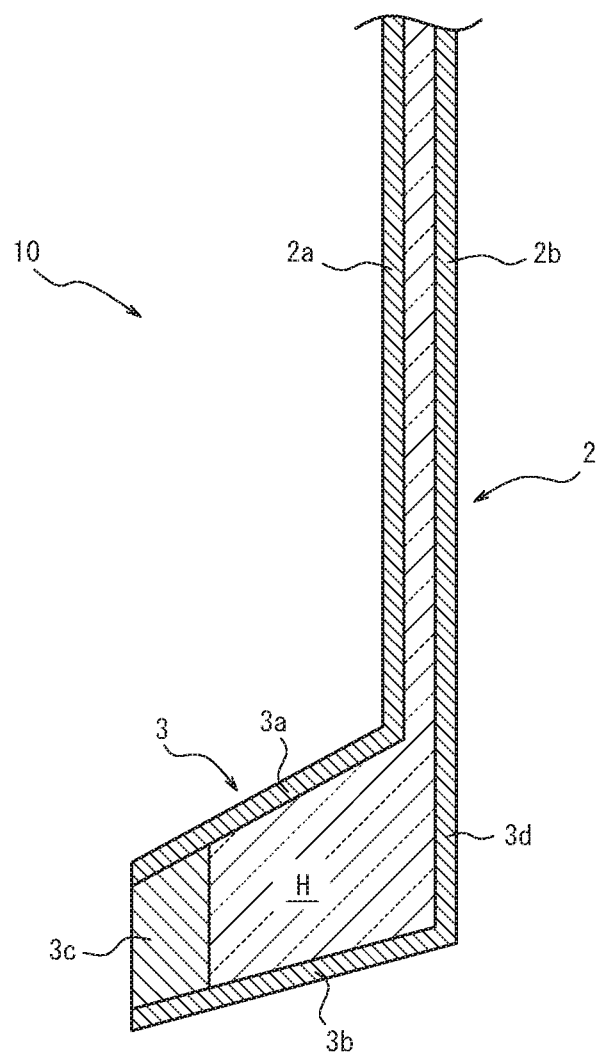

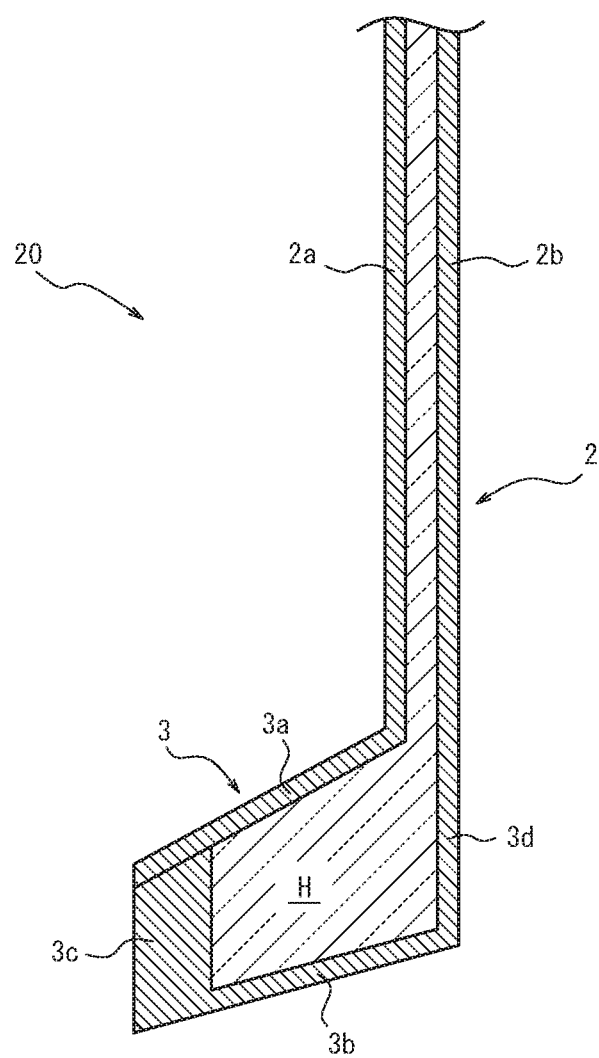

HEAT SHIELDING MEMBER, SINGLE CRYSTAL PULLING APPARATUS, AND METHOD OF PRODUCING SINGLE CRYSTAL SILICON INGOT

TECHNICAL FIELD

This disclosure relates to a heat shielding member, a single crystal pulling apparatus, and a method of producing a single crystal silicon ingot using the single crystal pulling apparatus.

BACKGROUND

Typically, a silicon wafer obtained by performing a wafer processing process on a single crystal silicon ingot grown by the Czochralski (CZ) process is used as a substrate of a semiconductor device.

FIG. 1 illustrates an example of a typical single crystal pulling apparatus for growing a single crystal silicon ingot by the CZ process. A single crystal pulling apparatus 100 depicted in FIG. 1 is provided with a crucible 52 for containing a feedstock material of a single crystal silicon ingot I in a chamber 51, and the depicted crucible 52 is made up of a quartz crucible 52a and a graphite crucible 52b. A crucible rotating/elevating shaft 53 for rotating the crucible 52 in a circumferential direction and elevating the crucible 52 in the vertical directions is attached to the bottom of this crucible 52. Further, a heater 54 is placed around the crucible 52, and the feedstock material contained in the crucible 52 is heated to obtain a silicon melt M.

A pulling shaft 55 for pulling up the single crystal silicon ingot I is provided in an upper part of the chamber 51, and a seed crystal S is held in a seed crystal holder 56 fixed to the tip of the pulling shaft. Further, a gas inlet port 57 and a gas outlet port 58 are provided in the upper part and the lower part of the chamber 51, respectively, so that while the single crystal silicon ingot I is grown, an inert gas is supplied into the chamber 51 through the gas inlet port 57, flown along the outer circumferential surface of the ingot I, and discharged through the gas outlet port 58.

Further, a cylindrical heat shielding member 60 surrounding the outer circumferential surface of the ingot I being grown is provided in the chamber 51. FIG. 2 illustrates an example of the structure of the conventional heat shielding member 60. The heat shielding member 60 depicted in this drawing includes a cylindrical tubular portion 61 surrounding the outer circumferential surface of the single crystal silicon ingot I and a projecting portion 62 under the tubular portion 61 (for example, see JP 2004-107132 A (PTL 1)). Here, the tubular portion 61 has an inner wall 61a and an outer wall 61b. Further, the projecting portion 62 has an upper wall 62a, a bottom wall 62b, and two vertical walls 62c, 62d. A heat insulating material (heat storage material) H is provided in the space surrounded by these walls.

Such a heat shielding member 60 shields radiant heat from the heater 54, the silicon melt M, the crucible 52 and the side walls and helps to cool the single crystal silicon ingot I to be pulled up; meanwhile, the temperature of the outer circumferential surface of the ingot I is kept by the heat insulating material H of the projecting portion 62 heated by the heater 54 and the silicon melt M thereby preventing the increase in the difference of the temperature gradient in the crystallographic axis direction between a center portion and a peripheral portion of the single crystal silicon ingot I.

Using the above apparatus 100, the single crystal silicon ingot I is grown as described below. First, with an inert gas atmosphere of Ar gas etc. being kept in the chamber 51 having been depressurized, the feedstock material such as polycrystalline silicon contained in the crucible 52 is heated by the heater 54, thus the silicon melt M is obtained. Next, the pulling shaft 55 is lowered to dip the seed crystal S into the silicon melt M. and the pulling shaft 55 is pulled upward while the crucible 52 and the pulling shaft 55 are rotated in a predetermined direction. Thus, the single crystal silicon ingot I can be grown under the seed crystal S.

In the single crystal silicon ingot I grown using the above apparatus 100, various types of grown-in defects that are problematic in the device formation process are formed. The distribution of those grown-in defects in the radial direction of the ingot I is known to depend on two factors, that is, the rate of pulling up the crystal (crystal pulling rate) V and the temperature gradient G at the solid-liquid interface in the direction in which the single crystal is pulled up (for example, see "The Mechanism of Swirl Defects Formation in Silicon", Journal of Crystal Growth, Vol. 59, 1982, pp. 625-643 (NPL 1)).

FIG. 3 is a diagram illustrating the relationship between the ratio V/G of the pulling rate V with respect to the temperature gradient G at the solid-liquid interface and the crystal region forming the silicon single crystal silicon ingot I. As illustrated in the diagram, when the value of V/G is high, the single crystal silicon ingot is predominated by a COP formation region 71 which is a crystal region where vacancies are formed to result in particles originated from the crystal (crystal originated particles: COPs) are detected.

When the value of V/G is made low, performing a certain oxidizing heat treatment forms an oxidation induced potential OSF nuclei region 72 in which so-called stacking faults (OSFs) are distributed in a ring pattern, and COPs are not detected in this OSF region 72.

When the value of V/G is made even lower, the formation of an oxygen precipitation promoted region (hereinafter also referred to as a "Pv region") 73 which is a crystal region where oxygen precipitates are present and COPs are not detected is formed, followed by the formation of an oxygen precipitation suppressed region (hereinafter also referred to as a "Pi region") 74 which is a crystal region where oxygen is hardly precipitated and COPs are not detected and the formation of a dislocation cluster region 75 where dislocation clusters are detected.

In a silicon wafer cut out from the single crystal silicon ingot I exhibiting such a defect distribution depending on V/G, the crystal regions other than the COP formation region 71 and the dislocation cluster region 75 are crystal regions regarded as defect-free regions, which are normally free of defects, and a silicon wafer cut out from these crystalline regions is recognized as a defect-free silicon wafer.

CITATION LIST

Patent Literature

PTL 1: JP 2004-107132 A

Non-Patent Literature

NPTL 1: "The Mechanism of Swirl Defects Formation in Silicon", Journal of Crystal Growth, Vol. 59, 1982, pp. 625-643

SUMMARY

Technical Problem

Since the difference between the value V/G for the above COP formation region 71 and the value V/G for the dislocation cluster region 75 is very small, the pulling rate V must be strictly controlled to grow a defect-free single crystal silicon ingot I. However, such control of the pulling rate V is very difficult, and it remains desirable to find ways to expand the range (margin) of the crystal pulling rate V with which a defect-free single crystal silicon ingot I can be obtained.

It could therefore be helpful to provide a heat shielding member, a single crystal pulling apparatus, and a method of producing a single crystal silicon ingot using the single crystal pulling apparatus, which can expand the margin of the crystal pulling rate with which a defect-free single crystal silicon can be obtained.

Solution to Problem

We propose the following features to address the above challenges.

(1) A heat shielding member provided in a single crystal pulling apparatus for pulling a single crystal silicon ingot from a silicon melt which is stored in a quartz crucible and is heated by a heater placed around the crucible, the heat shielding member comprising a cylindrical tubular portion surrounding an outer circumferential surface of the single crystal silicon ingot: and a ring-shaped projecting portion under the tubular portion, wherein the projecting portion has an upper wall, a bottom wall, and two vertical walls; and a heat insulating material with a ring shape surrounded by those walls, and there is a gap between one of the vertical walls that is adjacent to the silicon ingot and the heat insulating material.

(2) A heat shielding member provided in a single crystal pulling apparatus for pulling a single crystal silicon ingot from a silicon melt which is stored in a quartz crucible and is heated by a heater placed around the crucible, the heat shielding member comprising a cylindrical tubular portion surrounding an outer circumferential surface of the single crystal silicon ingot; and a ring-shaped projecting portion under the tubular portion, wherein the projecting portion has an upper wall, a bottom wall, and two vertical walls; and a heat insulating material with a ring shape surrounded by those walls, a surface of the vertical wall adjacent to the single silicon ingot on the heat insulating material side is in contact with the heat insulating material, and a difference between a diameter of an opening of the heat shielding member and a diameter of an opening of the heat insulating material exceeds 5 mm.

(3) The heat shielding member according to (1) or (2) above, wherein the vertical wall adjacent to the single crystal silicon ingot and the bottom wall are integrally formed.

(4) The heat shielding member according to any one of (1) to (3) above, wherein the vertical wall adjacent to the single crystal silicon ingot has a carbon material.

(5) A single crystal pulling apparatus comprising the heat shielding member according to any one of (1) to (4) above.

(6) A method of producing a single crystal silicon ingot using the single crystal pulling apparatus according to (5) above.

Advantageous Effect

According to this disclosure, the margin of the crystal pulling rate with which a defect-free single crystal silicon ingot can be obtained can be expanded.

BRIEF DESCRIPTION OF THE DRAWINGS

In the accompanying drawings:

FIG. 5 is a diagram illustrating an example of a heat shielding member according to this disclosure;

FIG. 6 is a diagram illustrating another example of a heat shielding member according to this disclosure;

FIG. 7 is a diagram illustrating a heat shielding member in which vertical walls and a bottom wall are integrally formed;

DETAILED DESCRIPTION

Embodiments of this disclosure will now be described with reference to the drawings. A heat shielding member according to this disclosure is provided in a single crystal pulling apparatus for pulling a single crystal silicon ingot from a silicon melt which is stored in a quartz crucible and is heated by a heater placed around the crucible, and the heat shielding member includes a cylindrical tubular portion surrounding an outer circumferential surface of the single crystal silicon ingot; and a ring-shaped projecting portion under the tubular portion. Here, the projecting portion has an upper wall, a bottom wall, and two vertical walls; and a heat insulating material with a ring shape surrounded by those walls.

As described above, the distribution of crystal defects in the radial direction of the single crystal silicon ingot I depends on the ratio V/G of the pulling rate V with respect to the temperature gradient G. Here, the pulling rate V determines the amounts of interstitial silicon atoms and vacancies introduced into the ingot I. On the other hand, the temperature gradient G determines the diffusion rates of interstitial silicon atoms and vacancies.

The margin of the crystal pulling rate V with which a defect-free single crystal silicon ingot I can be obtained (hereinafter also simply referred to as "pulling rate margin") can be expanded by making flat the distribution of crystal defects in the ingot I. The critical ratio $(V/G)_{cri}$ at which the distribution of crystal defects in the radial direction is made flat can be calculated theoretically from the conditions under which the concentration of vacancies and the concentration of interstitial silicon atoms are equal, and is given by the following formula (1) (for example, see K. Nakamura, R. Suewaka and B. Ko, ECS Solid State Letters, 3 (3) N5-N7 (2014).

$$\left(\frac{V}{G}\right)_{cri} = 6.68 \times 10^{-4} \sigma_{mean} + 0.159, \quad (1)$$

where $\sigma_{mean}$ is the film stress at a given position in the crystal.

As is evident from the formula (1), the $(V/G)_{cri}$ at which the interstitial silicon atoms concentration and the vacancy concentration are equal depends on the film stress in the crystal. The above $(V/G)_{cri}$ can be estimated by determining the stress distribution in the crystal by heat transfer calculation etc. Further, since the pulling rate V is fixed in the radial direction of the ingot I, the ideal temperature gradient for achieving a flat distribution of crystal defects in the radial direction (hereinafter also referred to as "ideal temperature gradient $G_{ideal}$") can also be determined as follows from the above formula (1).

$$G_{ideal} = V/(6.68 \times 10^{-4} \sigma_{mean} + 0.159) \quad (2)$$

Figure 4A:
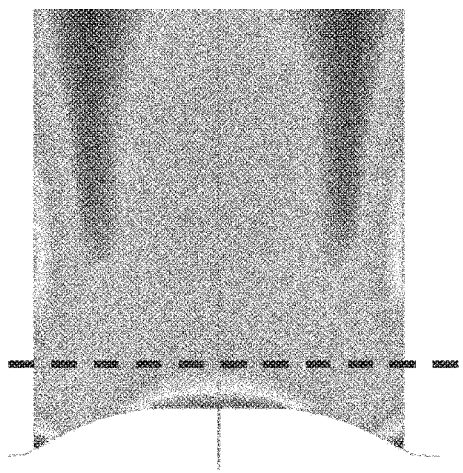
FIG. 4A is a diagram illustrating an example of the stress distribution of a single crystal silicon ingot.
Figure 4B:
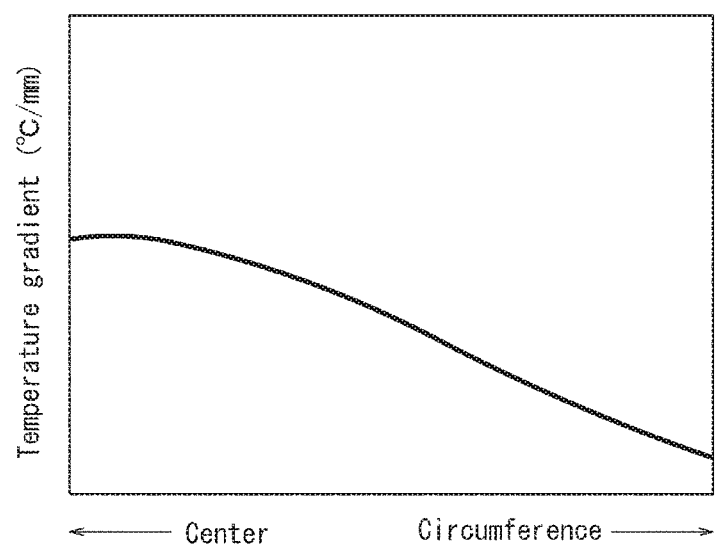
FIG. 4B is a diagram illustrating an example of the ideal temperature gradient $G_{ideal}$.

FIG. 4A illustrates an example of the stress distribution in the crystal, and FIG. 4B illustrates an example of the ideal temperature gradient. If the ideal temperature gradient $G_{ideal}$ as illustrated in FIG. 4B can be achieved, the distribution of crystal defects in the single crystal silicon ingot I can be made flat and the margin of the pulling rate can be maximized by pulling up the ingot I at the corresponding pulling rate V.

The temperature gradient G of the single crystal silicon ingot I depends on the structure of the heat shielding member 60. In order to achieve the above ideal temperature gradient $G_{ideal}$, the inventors of this disclosure carried out a detailed study of the relationship between the structure of the heat shielding member 60 and the temperature gradient G. As a result, they found that the temperature gradient G approaches to $G_{ideal}$ as the diameter of an opening O in the heat shielding member 60 through which the ingot I is inserted (hereinafter also referred to as "opening diameter") $R_s$ is increased. Note that the opening diameter $R_s$ is the diameter of the opening in the projecting portion 62.

Further, it was found that when the single crystal silicon ingot I is grown using a heat shielding member having a larger opening diameter $R_s$ than conventional ones, the distribution of crystal defects in the radial direction becomes flatter and the margin of the pulling rate is expanded.

Thus, the margin of the pulling rate can be expanded by increasing the opening diameter $R_s$; however, other problems such as the bend in the crystal or the crystal deformation arise instead. This is conceivably because when the opening diameter $R_s$ is increased, a low temperature area in the single crystal pulling apparatus 100 which can be seen from the silicon melt M is increased, which cools the silicon melt M, thus the temperature of the silicon melt M becomes instable. In order to make the temperature of such a silicon melt M stable, reducing the opening diameter $R_s$ is effective.

As described above, increasing the opening diameter $R_s$ in the projecting portion 62 of the heat shielding member 60 is effective for expanding the margin of the pulling rate, and reducing the opening diameter $R_s$ is effective for preventing the bend in the crystal or the crystal deformation. Thus, the expansion of the margin of the pulling rate is found to be traded off against the prevention of the bend in the crystal or the crystal deformation.

To address this, the inventors diligently studied ways to expand the margin of the pulling rate without causing the bend in the crystal or the crystal deformation. Thereupon, they contemplated increasing the opening diameter $R_h$ of the heat insulating material H without changing the opening diameter $R_s$ of the heat shielding member 60.

As described above, the temperature gradient G of the single crystal silicon ingot I depends on the structure of the heat shielding member 60; however, the temperature gradient G depends on the heat insulating material H with which the heat input to the surface of the single crystal silicon ingot I is controlled. On the other hand, in order to make the temperature of the silicon melt M stable, increasing the flow rate of the inert gas such as Ar gas flown between the single crystal silicon ingot I and the heat shielding member 60 is effective, and the flow rate of the inert gas depends on the outer shape of the heat shielding member 60.

Given this situation, the inventors found that the bend in the crystal and the crystal deformation can be suppressed, and the temperature gradient G can be made to approximate to the ideal temperature gradient $G_{ideal}$ to expand the margin of the pulling rate, by increasing the opening diameter $R_h$ of the heat insulating material H without changing the opening diameter $R_s$ of the heat shielding member 60. This disclosure is based on the above findings.

FIG. 5 illustrates an example of a heat shielding member according to this disclosure. The heat shielding member 1 depicted in this drawing includes a cylindrical tubular portion 2 surrounding the outer circumferential surface of the single crystal silicon ingot I and a projecting portion 3 under the tubular portion 2. Here, the tubular portion 2 has an inner wall 2a and an outer wall 2b, and a heat insulating material H is provided between these walls. Further, the projecting portion 3 has an upper wall 3a, a bottom wall 3b, and two vertical walls 3c, 3d, and the heat insulating material H with a ring shape is provided in the space surrounded by those walls. Note that the above heat shielding member 1 is configured such that the vertical wall 3c is adjacent to the ingot I.

In the heat shielding member 1 depicted in FIG. 5, a gap (space) V is provided between the vertical wall 3c and the heat insulating material H. Thus, the temperature gradient G of the crystal 1 can be made to approximate to the ideal temperature gradient $G_{ideal}$ by increasing the opening diameter $R_h$ of the heat insulating material H, thereby expanding the margin of the pulling rate. Further, when the opening diameter $R_s$ of the heat shielding member 1 used is the same as a conventional one, the flow rate of the inert gas flown between the ingot I and the heat shielding member 1 is maintained, thus the bend in the crystal and the crystal deformation can be suppressed.

In the conventional heat shielding member 60, the walls covering the heat insulating material H merely serve as covering members for preventing part of the heat insulating material H from dropping into the silicon melt M; accordingly, the concept of this disclosure of increasing the opening diameter $R_h$ of the heat insulating material H without changing the opening diameter $R_s$ of the heat shielding member 60 thereby differentiating the opening diameters is unprecedented.

As illustrated in FIG. 5, the opening diameter $R_s$ of the heat shielding member 1 is the distance from a central axis A of the ingot I (i.e., the pulling shaft of the pulling apparatus) to the surface of the vertical wall 3c on the ingot I side, and the opening diameter $R_h$ of the heat insulating material H is the distance from the central axis A of the ingot I to the inner wall surface of the heat insulating material H.

In the heat shielding member 1 according to this disclosure, the difference R between the opening diameter $R_s$ of the heat shielding member 1 and the opening diameter $R_h$ of the heat insulating material $H_d$ may only be larger than that of the heat shielding member 60. For the heat shielding member 1 depicted in FIG. 5, this is achievable by providing the gap V between the vertical wall 3c and the heat insulating material H.

Figure 2:
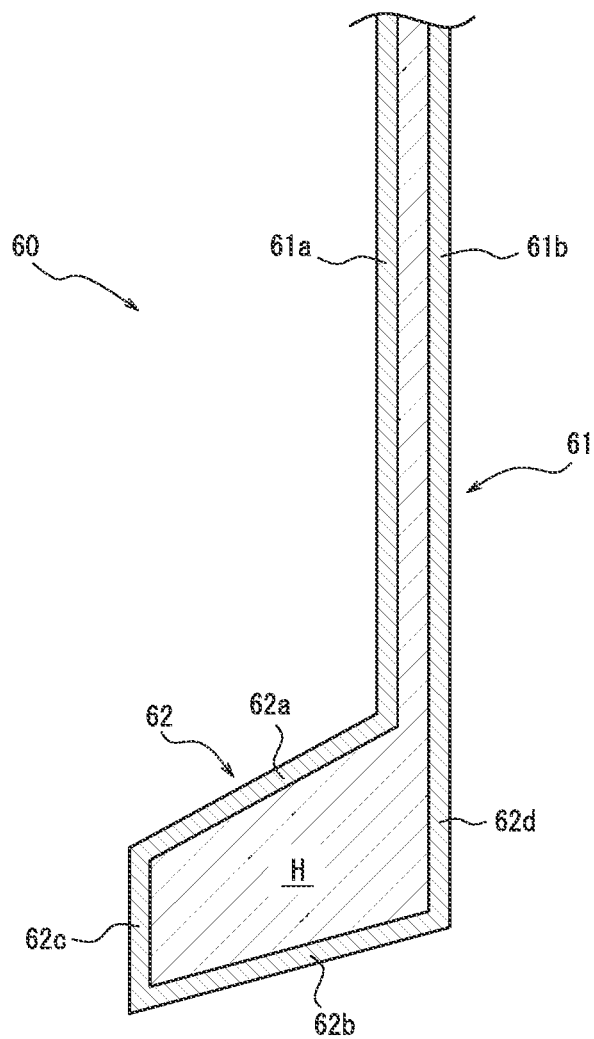
FIG. 2 is a diagram illustrating an example of a heat shielding member.
Figure 3:
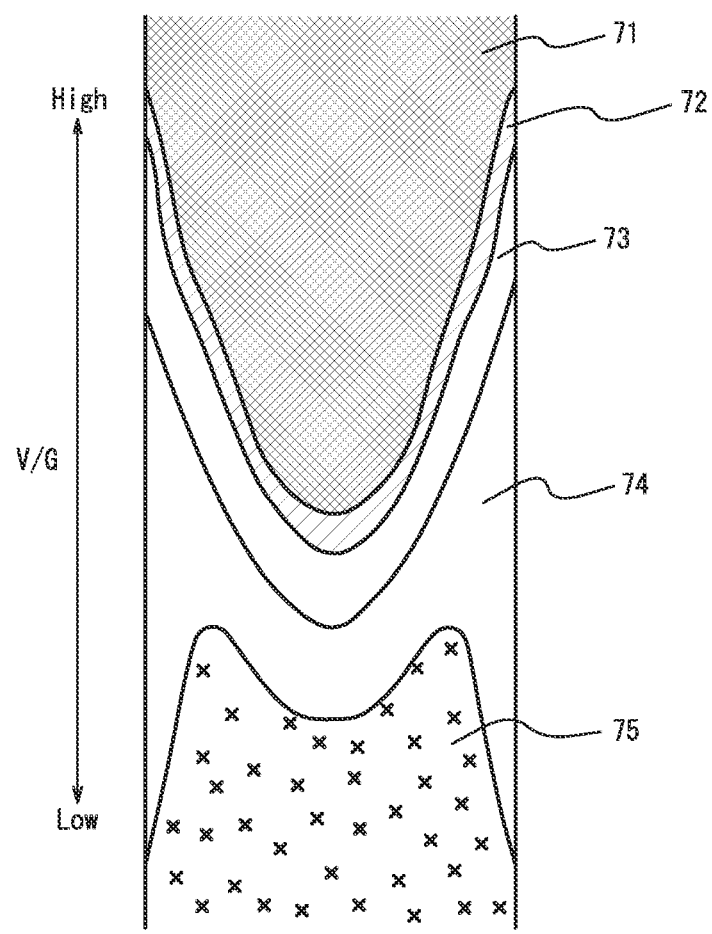
FIG. 3 is a diagram illustrating the relationship between the ratio of the pulling rate with respect to the temperature gradient in the solid-liquid interface and a crystal region forming a single crystal silicon ingot.

As described above, in the conventional heat shielding member 60 illustrated in FIG. 2, the walls 62a to 62d only serve as covering materials for preventing part of the heat insulating material H from dropping into the silicon melt M, and the space surrounded by those walls is filled tight with the heat insulating material. The thickness of those walls 62a to 62d was approximately around 5 mm to 10 mm, although depending on the walls.

Accordingly, for example, the difference $R_d$ between the opening diameter $R_s$ of the heat shielding member 1 and the opening diameter $R_h$ of the heat insulating material H may exceed 5 mm, may exceed 6 mm, may exceed 7 mm, 8 mm, may exceed 9 mm, may exceed 10 mm, may be 12 mm or more, or may be 15 mm or more, although depending on the thickness of the vertical wall 3c.

In this disclosure, the margin of the pulling rate is expanded by making the opening diameter of the heat insulating material H larger than that of such a conventional heat shielding member 60 to make flat the distribution of crystal defects in the radial direction. The above difference $R_d$ between the opening diameters is preferably 25 mm or more, more preferably 70 mm or more in terms of further expanding the margin of the pulling rate. Further, in terms of increase in the heat load on the quartz crucible due to the extraction of the heat insulating material and preventing dislocations from being formed in the crystal to be pulled due to the heat load, the difference $R_d$ between the opening diameters is preferably 200 mm or less, more preferably 150 mm or less.

Of the walls defining the outer shape of the heat shielding member 1, at least the vertical wall 3c is preferably formed of a material with high thermal conductivity to transfer well the radiant heat from the silicon melt M to the outer circumferential surface of the single crystal silicon ingot I. More preferably, the bottom wall 3b is also formed of a material with high thermal conductivity.

Examples of the above material with high thermal conductivity includes carbon materials such as graphite and metals such as molybdenum (Mo). Of those, the walls are preferably formed of the above carbon material, which results in little contamination.

The opening diameter of the projecting portion of the heat shielding member 1 is preferably 340 mm or more and 460 mm or less. This can increase the stability of the temperature of the silicon melt M by increasing the flow rate of the inert gas such as Ar gas flown between the single crystal silicon ingot I and the heat shielding member. More preferably, the diameter is 350 mm or more and 450 mm or less.

Further, the opening diameter of the heat insulating material H is preferably 355 mm or more and 475 mm or less. This can increase the stability of the temperature of the silicon melt M by increasing the flow rate of the inert gas such as Ar gas flown between the single crystal silicon ingot I and the heat shielding member. More preferably, the diameter is 365 mm or more and 465 mm or less.

FIG. 6 illustrates another example of a heat shielding member according to this disclosure. Note that like features of the heat shielding member 1 depicted in FIG. 6 and FIG. 5 are denoted by like reference numerals. In the heat shielding member 10 depicted in FIG. 6, no gap (space) V is provided between the vertical wall 3c and the heat insulating material H unlike the heat shielding member 1 depicted in FIG. 5. Alternatively, the heat shielding member 10 is configured such that the vertical wall 3c has a larger thickness than the conventional one, and the vertical wall 3c is in contact with the heat insulating material H. Thus, as well as the heat shielding member 1, the margin of the pulling rate with which defect-free crystalline silicon can be obtained can be expanded while suppressing the bend in the crystal or the formation of crystal defects, by making the opening diameter $R_h$ of the heat insulating material H larger than that of the conventional one.

Note that as with the heat shielding member 20 depicted in FIG. 7, the vertical wall 3c adjacent to the single crystal silicon ingot I and the bottom wall 3b are preferably integrally formed. Thus, radiant heat from the bottom wall 3b can be transferred to the ingot I more easily, and the temperature gradient G can be made to approximate more closely to the ideal temperature gradient $G_{ideal}$. This also applies to the heat shielding member 1 depicted in FIG. 5.

Further, in the heat shielding members 1, 10, and 20 depicted in FIGS. 5 to 7, the projecting portion 3 projects inside the tube; however, heat shielding members in which the projecting portion 3 projects outside the tube are also covered by this disclosure.

(Single Crystal Pulling Apparatus)

A single crystal pulling apparatus according to this disclosure includes the disclosed heat shielding member described above. Accordingly, the apparatus is not limited except for the structure of the heat shielding member, and can be suitably configured to be capable of growing a desired single crystal silicon ingot.

Figure 1:
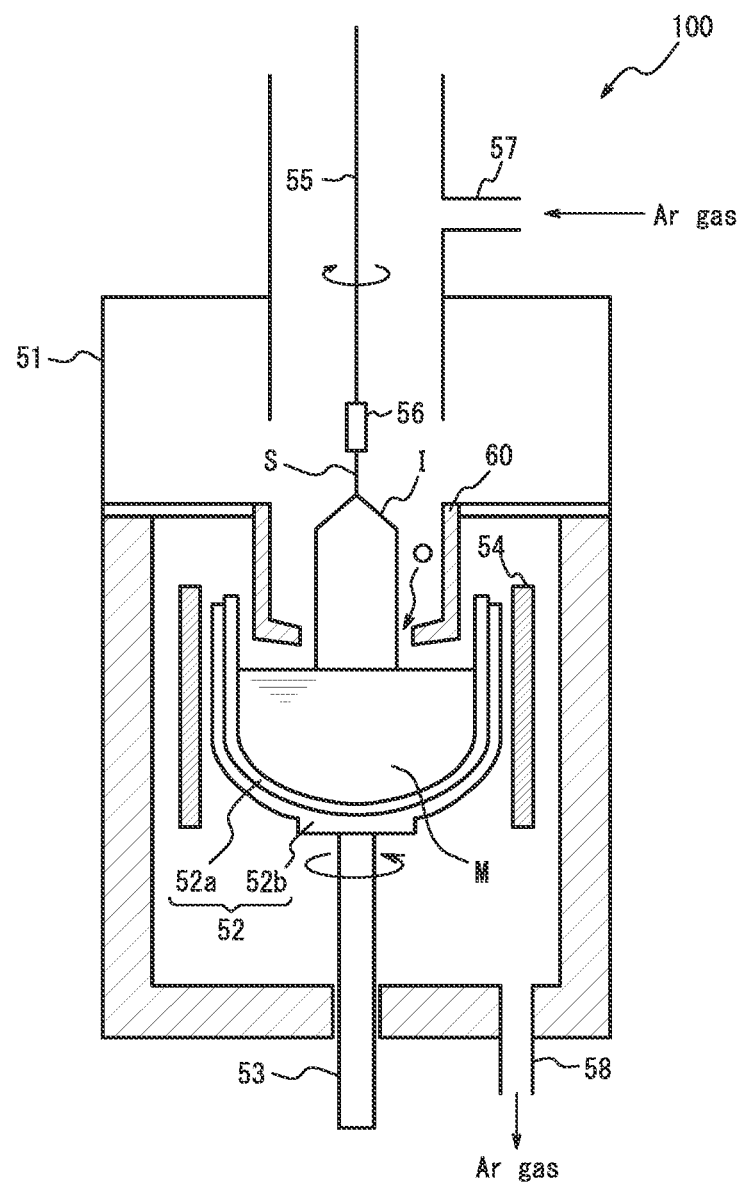
FIG. 1 is a diagram illustrating an example of a typical single crystal pulling apparatus.

For example, based on the single crystal pulling apparatus 100 depicted in FIG. 1, a single crystal pulling apparatus according to this disclosure can be obtained by adopting the heat shielding member 1, 10, or 20 according to this disclosure illustrated in FIG. 5 to FIG. 7 instead of the heat shielding member 60. Further, using the disclosed single crystal pulling apparatus, a defect-free single crystal silicon ingot can be grown while suppressing the crystal deformation.

(Method of Producing Silicon Single Crystal)

Further, in a method of producing single crystal silicon according to this disclosure, silicon crystal silicon is produced using the disclosed single crystal pulling apparatus described above. Accordingly, the method is not limited except that the disclosed single crystal pulling apparatus described above is used, and can be suitably designed to be capable of growing a desired single crystal silicon ingot.

For example, a single crystal silicon ingot can be produced as described below using the single crystal pulling apparatus 100 depicted in FIG. 1 adopting the disclosed heat shielding member 1 illustrated in FIG. 5 or the disclosed heat shielding member 10 illustrated in FIG. 6 instead of the heat shielding member 60. First, with an inert gas atmosphere of Ar gas etc. being kept in the chamber 51 having been depressurized, a feedstock material such as polycrystalline silicon contained in the crucible 52 is heated by the heater 54, thus the silicon melt M is obtained. Next, the pulling shaft 55 is lowered to dip the seed crystal S into the silicon melt M, and the pulling shaft 55 is pulled upward while the crucible 52 and the pulling shaft 55 are rotated in a predetermined direction. Thus, a defect-free single crystal silicon ingot can be grown while suppressing the bend in the crystal or the crystal deformation.

EXAMPLES

Examples of the disclosure will now be described; however, the disclosure is not limited to the Examples.
<Growing Single Crystal Silicon Ingot>

Example 1

Single crystal silicon was produced according to the disclosed method of producing single crystal silicon. Specifically, a single crystal pulling apparatus was used which had the same structure as the single crystal pulling apparatus 100 depicted in FIG. 1 except that the heat shielding member 1 depicted in FIG. 5 was adopted instead of the heat shielding member 60. A graphite material having a surface coated with SiC was used for the upper wall 3a, the bottom wall 3b, and the vertical walls 3c, 3d of the heat shielding member 1. The thickness of the upper wall 3a was 7 mm, the thickness of the bottom wall 3b was 5 mm, and the thickness of the vertical wall 3c was 5 mm, and the thickness of the vertical wall 3d was 7 mm. Further, the width of the gap between the vertical wall 3c and the heat insulating material H in the radial direction was 100 mm.

Example 2

Single crystal silicon was produced in the same manner as Example 1 except for the following points. However, a single crystal pulling apparatus was used which had the same structure as the single crystal pulling apparatus 100 depicted in FIG. 1 except that the heat shielding member 10 depicted in FIG. 6 was adopted instead of the heat shielding member 60. Further, the thickness of the vertical wall 3c was 50 mm. All the other conditions were the same as those in Example 1.

Comparative Example

Single crystal silicon was produced using the single crystal pulling apparatus 100 depicted in FIG. 1. All the other conditions were the same as those in Example 1.
<Evaluation of Temperature Gradient>

Figure 8:
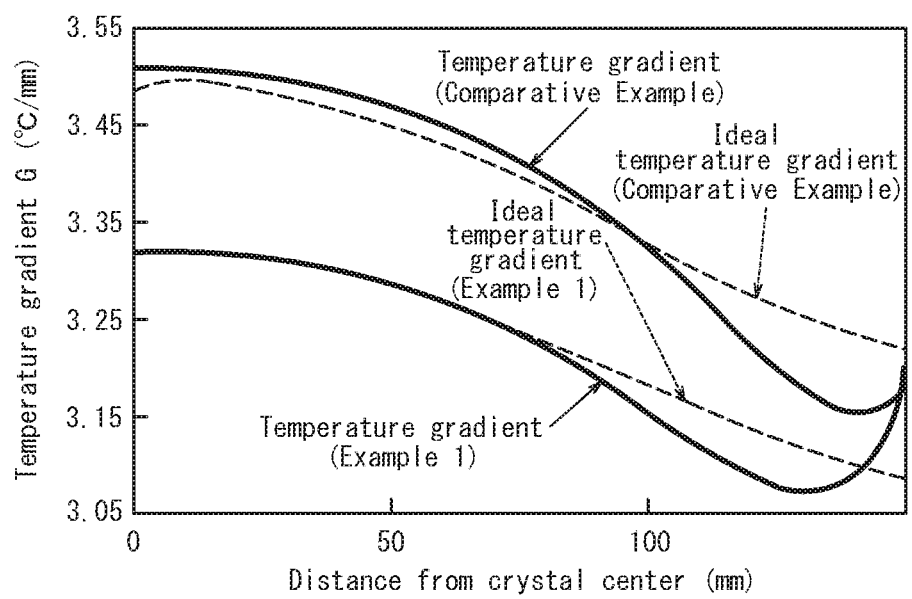
FIG. 8 is a diagram illustrating the temperature gradient of a single crystal silicon ingot grown using a single crystal pulling apparatus including the heat shielding member depicted in FIG. 5.

FIG. 8 illustrates the relationship between the temperature gradient G and the ideal temperature gradient $G_{ideal}$ of a single crystal silicon ingot grown using a single crystal pulling apparatus including the heat shielding member 1 depicted in FIG. 5. For the purpose of comparison, FIG. 8 also illustrates the case of growing single crystal silicon using the apparatus depicted in FIG. 1. To evaluate the deviation of the temperature gradient G from the ideal temperature gradient $G_{ideal}$, the difference between the temperature gradient G and the ideal temperature gradient $G_{ideal}$ was determined for 41 sample points in the temperature gradient profile illustrated in FIG. 8, and the average and the standard deviation were calculated.

TABLE 1

| levels | Number of sample points | Average | Standard deviation |
|---|---|---|---|
| Example 1 | 41 | 0.018512 | 0.019532 |
| Example 2 | 41 | 0.026151 | 0.021762 |
| Comparative Example | 41 | 0.030852 | 0.024800 |

Figure 9:
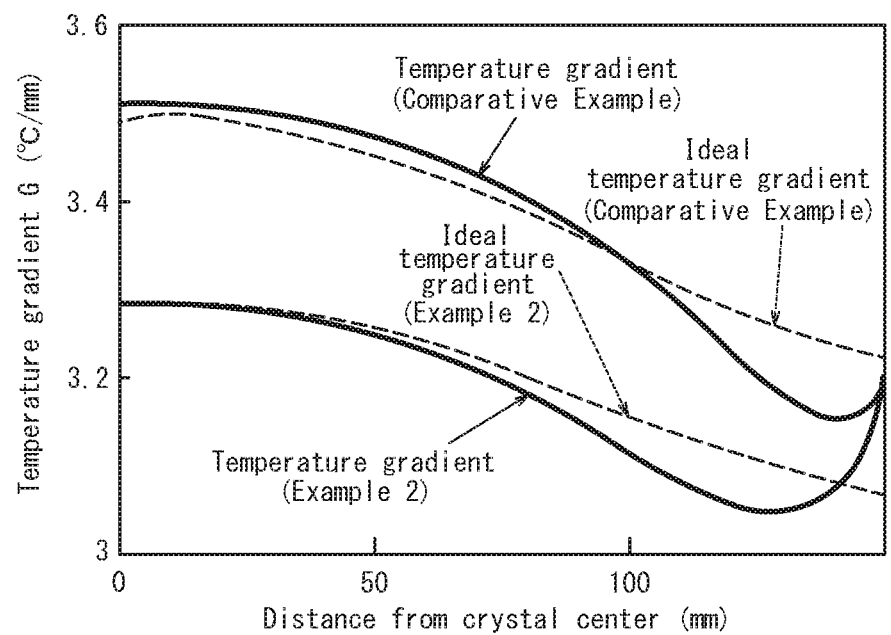
FIG. 9 is a diagram illustrating the temperature gradient of a single crystal silicon ingot grown using a single crystal pulling apparatus including the heat shielding member depicted in FIG. 6.

FIG. 9 illustrates the relationship between the temperature gradient G and the ideal temperature gradient $G_{ideal}$ of a single crystal silicon ingot grown using a single crystal pulling apparatus including the heat shielding member 10 depicted in FIG. 6. For the purpose of comparison, FIG. 9 also illustrates the case of growing single crystal silicon using the apparatus depicted in FIG. 1. The same evaluation as in the case of the above heat shielding member 1 depicted in FIG. 5 was also performed for the heat shielding member 10 depicted in FIG. 6. The results are given in Table 1.

As is evident from Table 1, for both the heat shielding member 1 depicted in FIG. 5 and the heat shielding member 10 depicted in FIG. 6, the value of the standard deviation was smaller than that in Comparative Example, and the temperature gradient G was closer to the ideal temperature gradient $G_{ideal}$ as compared with that in Comparative Example.
<Evaluation of Crystal Deformation>

In each of Examples 1, 2 and Comparative Example, a defect-free single crystal silicon ingot was successfully grown. Specifically, the evaluation of deformation was performed using the deformation rate which is an index of the degree of the deformation of the single crystal silicon ingots obtained in Examples and Comparative Example (for example, see JP H09-087083). The deformation rate is a value defined with respect to the diameter of a single crystal silicon ingot as ((maximum diameter−minimum diameter)/minimum diameter)×100(%), and was 0.10% to 0.13% in Example 1, was 0.11% to 0.15% in Example 2, and was 0.09% to 0.16% in Comparative Example, meeting the required quality standards.
<Evaluation of Pulling Rate Margin>

For Examples 1, 2, and Comparative Example, the margin of the pulling rate V with which defect-free crystal silicon can be obtained was determined. As a result, the margin was 0.019 mm/min for Example 1, was 0.018 mm/min for Example 2, and was 0.016 mm/min for Comparative Example. As can be seen, this disclosure makes it possible to expand the margin of the pulling rate with which defect-free crystal silicon can be obtained.

INDUSTRIAL APPLICABILITY

This disclosure makes it possible to expand the margin of the crystal pulling rate with which defect-free single crystal silicon can be obtained, thus this disclosure is useful in the semiconductor industry.

REFERENCE SIGNS LIST 1, 10, 20, 60 Heat shielding member
2, 61 Tubular portion
2a, 61a Inner wall
2b, 61b Outer wall
3, 62 Bulging portion
3a, 62a Upper wall
3b, 62b Bottom wall
3c, 3d, 62c, 62d Vertical wall
51 Chamber
52 Crucible
52a Quartz crucible
52b Graphite crucible
53 Crucible rotating/elevating shaft
54 Heater
55 Pulling shaft
56 Seed crystal holder
57 Gas inlet port 58 Gas outlet port
71 COP formation region
72 Potential OSF nuclei region
73 Oxygen precipitation promoted region (Pv region)
74 Oxygen precipitation suppressed region (Pi region)
75 Dislocation cluster region
100 Single crystal pulling apparatus
A Central axis of ingot
H Heat insulating material
I Single crystal silicon ingot
M Silicon melt
O Opening
$R_s$ Opening diameter of heat shielding member
$R_h$ Opening diameter of heat insulating material
S Seed crystal

The invention claimed is:

1. A heat shielding member provided in a single crystal pulling apparatus for pulling a single crystal silicon ingot from a silicon melt which is stored in a quartz crucible and is heated by a heater placed around the crucible, the heat shielding member comprising a cylindrical tubular portion surrounding an outer circumferential surface of the single crystal silicon ingot; and a ring-shaped projecting portion under the tubular portion, wherein:
   the ring-shaped projecting portion has an upper wall, a bottom wall, and two vertical walls; and a heat insulating material with a ring shape surrounded by those walls,
   there is a gap between one of the vertical walls that is adjacent to the single crystal silicon ingot and the heat insulating material,
   the gap is defined by the upper wall of the projecting portion, the bottom wall of the projecting portion, the vertical wall that is adjacent to the single crystal silicon ingot, and the heat insulating material,
   the gap and the one of the vertical walls that is adjacent to the single crystal silicon ingot each extends in a direction parallel to a central axis of the single crystal silicon ingot, and
   a difference between a diameter of an opening of the heat shielding member and a diameter of an opening of the heat insulating material exceeds 5 mm and is 200 mm or less.

2. The heat shielding member according to claim 1, wherein the one of the vertical walls that is adjacent to the single crystal silicon ingot and the bottom wall are integrally formed.

3. The heat shielding member according to claim 2, wherein the one of the vertical walls that is adjacent to the single crystal silicon ingot has a carbon material.

4. The heat shielding member according to claim 2, wherein
   the difference between the diameter of the opening of the heat shielding member and the diameter of the opening of the heat insulating material is 15 mm or more and is 200 mm or less.

5. The heat shielding member according to claim 3, wherein
   the difference between the diameter of the opening of the heat shielding member and the diameter of the opening of the heat insulating material is 15 mm or more and is 200 mm or less.

6. The heat shielding member according to claim 1, wherein the one of the vertical walls that is adjacent to the single crystal silicon ingot has a carbon material.

7. The heat shielding member according to claim 6, wherein
   the difference between the diameter of the opening of the heat shielding member and the diameter of the opening of the heat insulating material is 15 mm or more and is 200 mm or less.

8. The heat shielding member according to claim 1, wherein
   the difference between the diameter of the opening of the heat shielding member and the diameter of the opening of the heat insulating material is 15 mm or more and is 200 mm or less.

* * * * *